United States Patent [19]

Lewyn

[11] Patent Number: 4,899,153
[45] Date of Patent: Feb. 6, 1990

[54] FAST HIGH-RESOLUTION ANALOG-TO-DIGITAL CONVERTER

[75] Inventor: Lanny L. Lewyn, Laguna Beach, Calif.

[73] Assignee: Brooktree Corporation, San Diego, Calif.

[21] Appl. No.: 846,545

[22] Filed: Apr. 3, 1986

[51] Int. Cl.[4] .............................................. H03M 1/14
[52] U.S. Cl. .................................... 341/156; 341/118; 341/163
[58] Field of Search ............................... 330/254, 278; 340/347 CC, 347 DA, 347 NT; 341/118, 156, 163-165

[56] References Cited

U.S. PATENT DOCUMENTS

| | | | |
|---|---|---|---|
| 4,176,398 | 11/1979 | Rider | 340/347 NT X |
| 4,200,863 | 4/1980 | Hodges et al. | 340/347 DA X |
| 4,547,763 | 10/1985 | Flamm | 340/347 CC |
| 4,620,179 | 10/1986 | Cooper et al. | 340/347 CC X |

Primary Examiner—William M. Shoop, Jr.
Assistant Examiner—Marc S. Hoff
Attorney, Agent, or Firm—Ellsworth R. Roston; Charles H. Schwartz

[57] ABSTRACT

An unknown analog signal is compared in amplitude with the signal from a digital-to-analog (D-A) converter. The converter, preferably monotonic, may be at least partially formed from a plurality of switches connected in a recursive array to define sub-sets having a recurrent relationship. An adjustable-gain amplifier produces a difference signal having an amplitude indicating the amplitude comparison. A flash converter converts the difference signal to binary signals. These binary signals are modified and fed back to the D-A converter to obtain from this converter an output signal having an amplitude approximating the amplitude of the unknown analog signal. A plurality of successive approximations of the analog signal may be provided in this manner. In at least one (1) of these approximations, the gain of the amplifier may be increased to increase the sensitivity of the approximation by increasing the gain of the difference signal. In such approximation(s), before the binary signals from the flash converter are fed back to the D-A converter, they are shifted downward in binary significance by a factor related to the increase in the amplifier gain. The flash converter may be formed from a plurality of comparators, each constructed and connected to indicate whether the amplifier signal has an amplitude within an individual voltage increment. One of these comparators may be more precise than the others to more accurately indicate the sign of the amplitude difference between the unknown analog signal and the digital-to-analog signal in some approximations, particularly the final approximations.

54 Claims, 6 Drawing Sheets

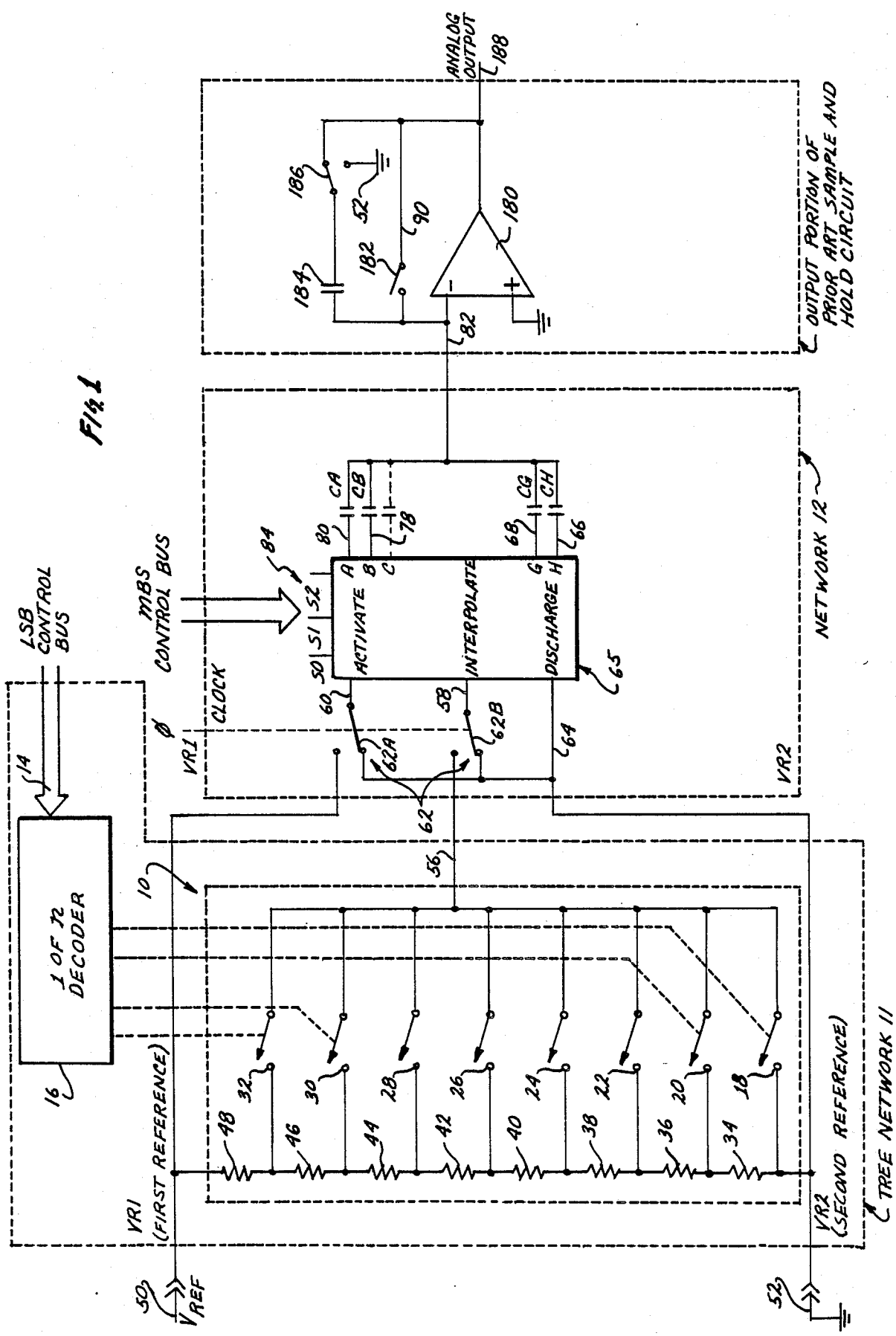

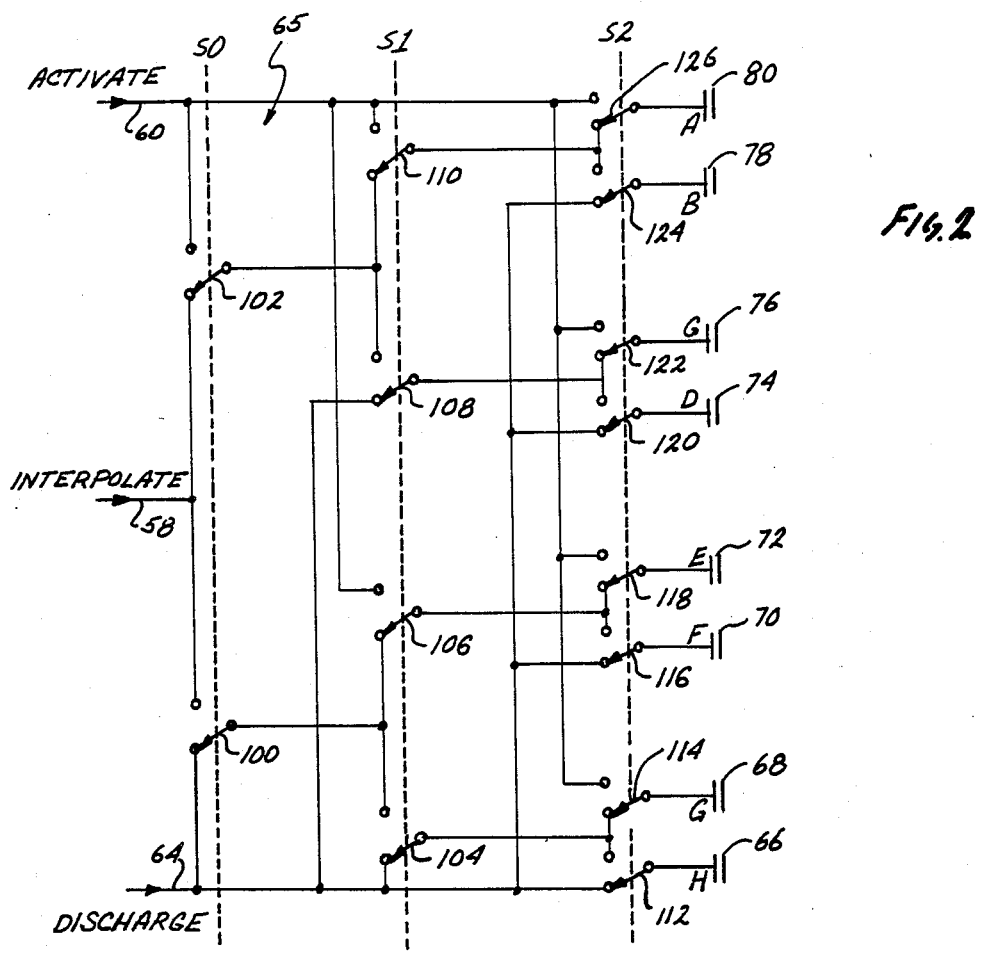

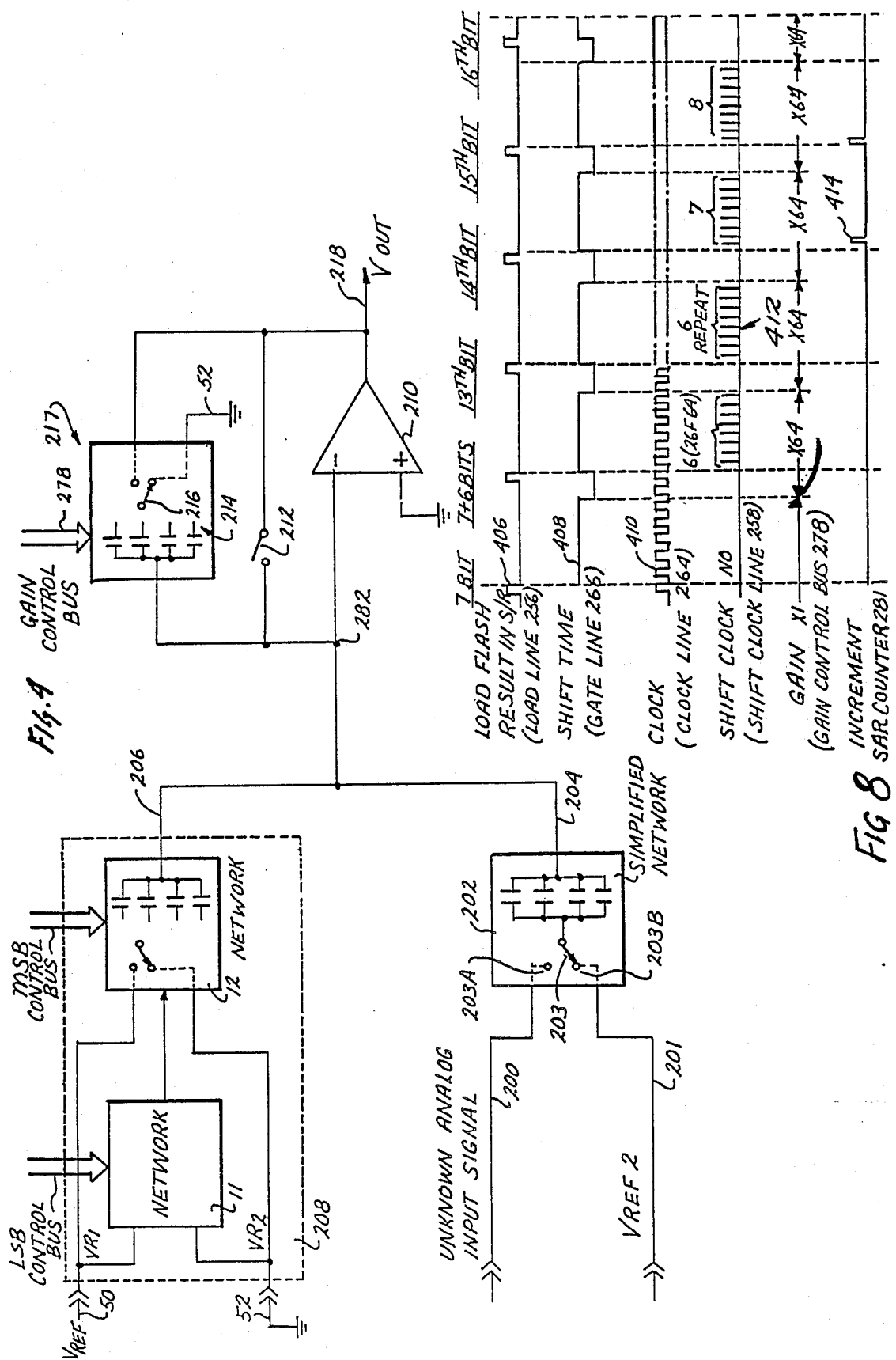

FAST HIGH-RESOLUTION ANALOG-TO-DIGITAL CONVERTER

This invention relates to apparatus for converting the amplitude of an unknown analog signal to a plurality of signals in binary coded form. The invention particularly relates to apparatus for providing an accurate and reliable conversion of the amplitude of the unknown analog signal to such binary coded signals and for providing such conversion in a minimal time.

It has been recognized for some time that the conversion of unknown analog signals to a plurality of signals in binary coded form is considerably more difficult than the conversion of binary coded signals to an analog signal having an amplitude coding for such binary coded signals. This difficulty is manifested in different ways. For example, it is difficult to provide an accurate and reliable conversion of the amplitude of an accurate analog signal to a plurality of signals in binary coded form. It is also difficult to provide such a conversion in a minimal period of time. It is particularly difficult to covert an unknown analog signal accurately and reliably to a plurality of binary signals in a minimal period of time.

Extensive thought and work have been devoted for several decades to obtain a satisfactory analog-to-digital converter which is accurate, reliable and fast. This effort has been particularly pronounced in recent decades because of the widespread adoption of computers and data processing systems for a wide variety of commercial and technological applications. For example, in some applications where analog controls have to be provided on a real-time basis, the variations in the controls are determined on a digital basis. As a result, in such applications, the analog error signals resulting from the operation of the controls have to be converted to a plurality of binary coded signals and these signals have to be processed by the data processing system so that the subsequent variations in the controls can be determined.

In spite of the extensive efforts over a period of several decades to provide analog-to-digital converters which are accurate, fast and reliable, satisfactory analog-to-digital converters now in use are not as fast, accurate or reliable as the data processing systems with which they are associated. As a result, the high resolution (12 bits or more) analog-to-digital converters now in use severely limit the speed of the data processing systems.

This invention provides a high resolution analog-to-digital converter which represents a distinct advance in the art relative to the analog-to-digital converters now in use. The converter of this invention is accurate and reliable and is considerably faster than the high resolution converters now in use. Furthermore, the converter is inherently monotonic and provides minimal linear and differential errors. The converters of this invention provide other distinct advantages over the prior art.

In the prior art, when converters provide a resolution of the unknown binary signal to as many as twelve (12) binary bits, the converters are slow in operation. This invention provides a converter which has a resolution of as many as sixteen (16) binary bits, and even higher, and which is considerably faster in operation than the converters in the prior art.

In one embodiment of the invention, an analog signal is compared in amplitude with the signal from a digital-to-analog (D-A) converter. The converter may be monotonic and may be at least partially formed from a plurality of switches connected in a repetitive array to define repetitive sub-sets. An adjustable-gain amplifier produces a difference signal having an amplitude indicating the amplitude comparison. A flash converter converts the difference signal to binary signals. These binary signals are modified and fed back to the D-A converter to obtain from the D-A converter an output signal having an amplitude approximating the amplitude of the analog signal.

A plurality of successive approximations of the unknown analog input signal may be provided in this manner. In at least one (1) of these approximations, the gain of the amplifier may be increased to increase the sensitivity of the approximation by increasing the gain of the difference signal. In these approximation(s), before the binary signals from the flash converter are fed back to the (D-A) converter, they are shifted downward in binary significance by a factor related to the increase in the amplifier gain.

The flash converter may be formed from a plurality of comparators, each constructed and connected to indicate whether the amplifier output signal has an amplitude within an individual voltage increment. One of these comparators may be more precise than the others to indicate precisely the sign of the amplitude difference between the unknown analog signal and the digital-to-analog signal in some approximations, particularly the final approximations.

When the difference signal is converted to binary signals, an additional binary signal of less significance may be included This additional binary signal is one binary digit lower in significance 1 (a factor of $\frac{1}{2}$) than the least significant bit of the binary difference signal. This additional binary signal modifies (is added to) the binary difference signal to facilitate control of the D-A converter in closely approximating the unknown analog signal.

The analog-to-digital converter constituting this invention is inherently advantageous over the prior art in providing accurate, fast and reliable conversions in the amplitude of an analog signal to a plurality of signals in binary coded form. The analog-to-digital converter constituting this invention is also advantageous because it includes a digital-to-analog converter which is disclosed and claimed in co-pending application U.S. Ser. No. 755,170 filed by me on July 15, 1985, for "Apparatus for Converting Between Digital and Analog Values" and assigned of record to the assignee of record of this application.

In the drawings:

FIG. 1 is a circuit diagram, partially in block form, of apparatus for converting between digital and analog values, this converter preferably being included in an analog-to-digital converter constituting one embodiment of this invention;

FIG. 2 is a circuit diagram which shows in additional detail certain of the features shown in block form in FIG. 1;

FIG. 3 is a truth table illustrating the operation of the circuitry shown in FIG. 2;

FIG. 4 is a block diagram schematically illustrating a system incorporating the converters shown in FIGS. 1 and 2 for converting the difference in amplitude between an unknown analog input signal and a digital to analog converter signal to analog output signal having a variable sensitivity;

FIG. 8 shows the time relationship of some of the important signals in performing a succession of approximations to the input signal.

Figure 5:
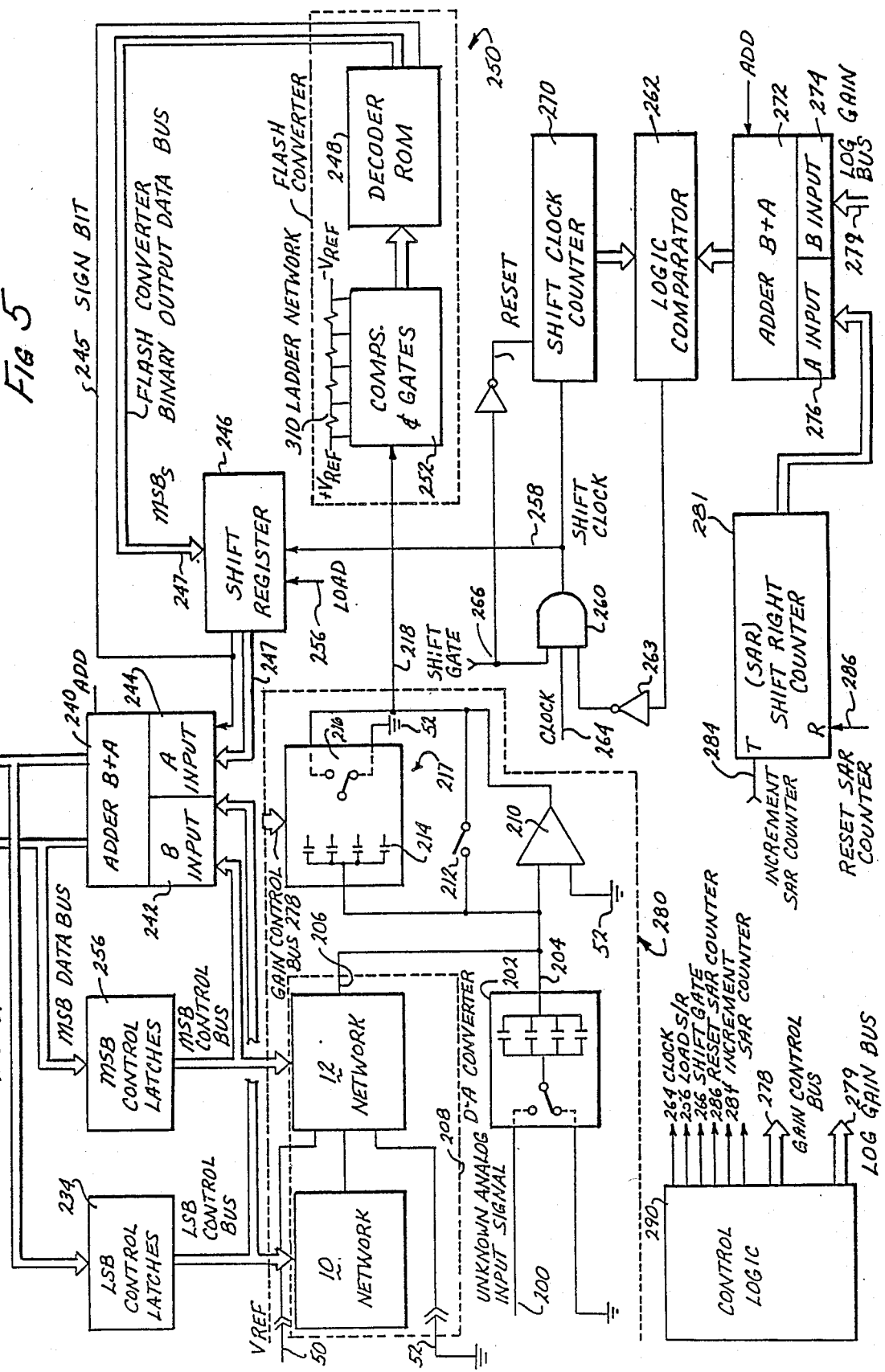
FIG. 5 is a block diagram schematically indicating additional details of the system for converting the amplitude of the unknown analog input signal to binary coded indications.

FIG. 1 illustrates certain stages included in on embodiment of the invention. This embodiment includes two different converters respectively indicated on a general basis at 10 and 12. Each of the converters 10 and 12 may include a plurality of switches connected in a matrix relationship. The converter 10 may be constructed in a number of different embodiments, all conventional. The converter 10 may also be constructed in various embodiments such as disclosed and claimed in co-pending United States applications Ser. Nos. 383,544 and 553,041. The converter 12 is preferably, although not necesssarily, contructed in a manner similar to the embodiments disclosed and claimed in co-pending applications Ser. Nos. 553,041 and 755,170. Both of these applications have been filed in the name of Henry Katzenstein as sole inventor and have been assigned of record to the assignee of record in ths application.

Each of the converters 10 and 12 converts into analog form digital values preferably coded by binary signals. These binary signals may have first and second logic levels respectively representing a binary "1" and a binary "0". The converter 10 converts the logic levels of binary signals of relatively low binary significance into analog form, and the converter 12 converts the logic levels of binary signals of relatively high binary significance into analog form.

The converter 10 is shown in FIG. 1 as converting three (3) binary bits into analog form, as represented by the magnitude of an output voltage from the converter. These binary bits are the three (3) binary bits of least binary significance. However, as will be appreciated, the converter 10 may convert any desired number of binary bits into analog form.

Similarly, the converter 12 is shown in FIG. 1 as converting three binary bits into analog form, as represented by the magnitude of an output current from the converter. These are the three (3) binary bits of highest binary sigificance. It will be appreciated, however, that the converter 12 may convert any desired number of binary bits into analog form.

The signals coded to represent the three least significant bits of a digital value coded in binary form are introduced in FIG. 1 through lines 14 into a decoder 16 which may be constructed in a conventional manner. The decoder 16 is operatively coupled to a plurality of normally open switches 18, 20, 22, 24, 26, 28, 30 and 32. The switches 18 through 32 (even numbers only) are connected to a voltage dividing network defined by a plurality of impedances such as resistances 34 through 48 (even numbers only). The resistances 34 through 48 (even numbers only) are connected between a first reference potential such as a voltage source 50 and a second reference potential such as a ground 52.

The decoder 16 operates to convert the binary signals on the lines 14 to produce a logic level output on one of the outputs. One of the switches 18 through 32 (even numbers only) is then closed by the decoder 16 in accordance with the binary signal value. For example, the switch 18 is closed for a value of "0"; the switch 24 is closed for a value of "3"; and the switch 30 is closed for a value of "6". Assuming that the voltage from the source 50 provides a first reference potential such as 1.6 volts, ground voltage is introduced through the switch 18 to an output line 56 upon the closure of the switch 18; a voltage of 0.6 volts is introduced to the line 56 upon a closure of the switch 24; and a voltage of 1.2 volts is introduced to the line 56 upon a closure of the switch 30.

The output line 56 from the converter 10 is connected to one contact of a double-pole switch 62 in the converter 12. A pole 62B of the switch 62 is connected to an interpolation line 58 in the converter 12 and that pole may be connected to either the output line 56 or to a second contact which is connected to the second reference potential such as the ground 52. The converter 12 also includes an activation line 60 which is connected to the other pole 62A of the double-pole switch 62. One contact of the pole 62A is connected to the second reference potential such as the ground 52 and the other contact of the pole 62A is connected to the source 50 of the first reference potential. An energy storage discharge line 64 of the converter 12 preferably receives the second reference potential such as the ground 52. The converter 12 includes repetitive array. This array has a repetitive pattern of switch connections to obtain the operation of the switches in a pattern dependent upon the binary coded input signals on the lines 12, 14 and 16, generally indicated at 65, which is formed from a plurality of switches. The repetitive array 65 is shown in detail in FIG. 2. Output terminals from the repetitive array 65 are connected to energy storage members such as capacitors 66 through 80 (even numbers only). Only some of these capacitors are shown in FIG. 1 but all are shown in FIG. 2. The charges in selected ones of the capacitors 66 through 80 (even numbers only) are introduced to a line 82 in FIG. 1.

The array 65 is constructed to connect successive ones of the capacitances 66 through 80 (even numbers only) to the activating line 60 for progressively increasing values coded by the logic levels of the binary signals introduced to the array 65 through lines 84 in FIG. 1. The capacitances connected to the line 60 become charged by the voltage produced on such line when the line is connected by the pole 62A to the source 50 of the first reference potential. As a result, the output current passing from the voltage source 50 through the matrix 65 and the capacitances to the line 82 has a magnitude corresponding in value to the most significant bits coded by the logic levels of the binary signals in the lines 84.

For every value represented by the binary signals in the lines 84, a particular one of the capacitances 66 through 80 is connected to the interpolation line 58. This particular capacitance is the one next to be connected to the line 60 for increasing values coded by the logic levels of the binary signals in the lines 84. This particular capacitance then becomes charged when the pole 62B connects the capacitance to the voltage on the line 56 and this charge is introduced to the output line 82. As a result, the output line 82 provides at each instant a voltage which has a magnitude corresponding to the analog value coded by the logic levels of the binary signals in the lines 14 and 84.

The switch 62 is periodically operative to position the two poles of the switch against the bottom contacts of the switch in FIG. 1 and then against the top contacts of the switch in FIG. 1. When the two poles of the switch 62 engage the bottom contacts of the switch, all of the capacitances 66 through 80 (even numbers only) discharge through the switch to the second reference potential such as the ground 52. An amplifier 180 is then reset by activating a reset signal on a reset line 90 and the output line 188 of the digital-to-analog converter is forced to a voltage near the second reference potential 52.

The reset signal is then de-activated and the poles of switch 62 then engage the top contacts of the switch in FIG. 1. The particular capacitances 66 through 80 (even numbers only) selected by the binary signals on the lines 84 are connected to the activating line 60 and become charged by the voltage from the first reference source 50. At the same time, the particular interpolation capacitance becomes charged in acccordance with the voltage on the line 56. The line 82 then produces a voltage having a magnitude corresponding to the analog value coded by the logic levels of the binary signals on the lines 14 and 84.

A preferred embodiment of the repetitive array 65 is shown in FIG. 2. The matrix 65 includes the interpolation line 58, the activation line 60 and the discharge line 64. The repetitive array 65 also includes a plurality of double pole switches 100 through 126 (even numbers only). The switches 100 and 102 may be considered to constitute a first sub-set; the switches 104, 106, 108 and 110 may be considered to constitute a second sub-set; and the switches 112 through 126 (even numbers only) may be considered to constitute a third sub-set. Each sub-set of switches receives, from an individual one of the lines 84, logic levels of binary signals having an individual binary significance. The switches 100 and 102 receive logic levels of binary signals having a lower binary significance than the binary signals received by the switches in the other sub-sets and the switches 104, 106, 108 and 110 receive logic levels of binary signals having a lower binary significance than the logic levels of the binary signals received by the switches 112 through 126 (even numbers only). As will be seen, the number of switches in each of the sub-sets is directly proportional to the binary significance of the binary signals introduced to that sub-set.

The switches shown in FIG. 2 are mechanical. However, as will be appreciated, the switches may be solid state. For example, embodiments of converters employing solid state switches are disclosed and claimed in co-pending applications Ser. Nos. 383,544 and 553,041. When solid state switches are employed, each of the switches 100 through 126 (even numbers only) may be replaced by a pair of switches. Actually, each of the switches 100 through 126 (even numbers only) may be considered as a pair with the movable contact and one pole defining one switch in the pair and the movable contact and the other pole defining the other switch in the pair.

One contact of the switch 100 is common with the line 64 and the other contact in the switch 100 is common with the line 58. Similarly, one contact in the switch 102 is common with the line 60 and the other contact in the switch is common with the line 58. Connections are made from the movable poles of the switch 100 to first contacts of the switches 104 and 106. Similarly, connections are made from the movable poles of the switch 102 to first contacts of the switches 108 and 110.

The second contact of the switch 104 is connected to the line 64 and the second contact of the switch 106 is connected to the line 60. Connections are correspondingly made from the second contact of the switch 108 to the line 64 and from the second contact of the switch 110 to the line 60. The movable poles of the switches 104, 106, 108 and 110 are respectively connected to first contacts of the switches 112 and 114, first contacts of the switches 116 and 118, first contacts of the switches 120 and 122 and first contacts of the switches 124 and 126.

The second contact of the switches 112, 116, 120 and 124 are connected to the line 64 and the second contacts of the switches 114, 118, 122 and 126 are conected to the line 60. The movable poles of the switches 112 through 126 (even numbers only) are respectively connected to first terminals of the capacitors 66 through 80 (even numbers only). As will be seen in FIG. 2 and as will be also seen in FIG. 3, the capacitors 66 through 80 (even numbers only) are respectively designated by the numerals H through A.

The movable poles of the switches 100 through 126 (even numbers only) are shown in FIG. 2 in the positions in which they are operative when the binary signals introduced to the switches have a logic level of "0". When the logic levels of the binary signals introduced through the lines 84 to the switches 100 through 126 (even numbers only) are coded to represent a binary "1", the movable poles of the switches move from engagement with the lower contacts in FIG. 2 to engagement with the upper contacts in that Figure.

With the movable contacts of the switches 100 through 126 (even numbers only) in the positions shown in FIG. 2, no connections are established between any of the capacitors 66 through 80 (even numbers only) and the activating line 60. As a result, none of the capacitors 66 through 80 (even numbers only) is charged by the voltage on the line 60. This corresponds to a binary value of "0" in accordance with the logic levels of the binary signals introduced to the lines 84. However, a connection is established which includes the interpolation line 58, the switch 102, the switch 110, the switch 126 and the capacitance 80. Then, when the poles of the switch 62 in FIG. 1 are moved to the upper contacts, this causes the capacitance 80 to become charged to a level dependent upon the voltage on the interpolating line 58, this voltage being received from the second matrix output line 56 through the pole 62B. As a result, a signal is introduced to the line 82 in FIG. 1 in accordance with the analog value coded by the logic levels of the binary signals introduced through the lines 14 (FIG. 1) to the converter 10.

When the decimal value coded by the logic levels of the binary signals introduced to the lines 84 in FIG. 1 has a value of "1" or binary "001" (the least significant binary bit being at the right), this causes the movable arms of the switches 100 and 102 to be moved in FIG. 2 to a position engaging the upper contacts of the switches. A connection is accordingly established which includes the activating line 60, the switch 102, the switch 110, the switch 126 and the capacitance 80. When the poles of switch 62 in FIG. 1 are moved to the upper contacts, this causes the capacitance 80 to be charged to a value equal to the first reference voltage on the line 50 in FIG. 1.

At the same time, a connection is established which includes the interpolating line 58, the switch 100, the switch 106, the switch 118 and the capacitance 72. The capacitance 72 accordingly becomes charged to a value dependent upon the voltage on the interpolating line 58. Since the charges in the capacitances 80 and 72 are introduced to the line 82 in FIG. 1, the total charge delivered to the line 82, and hence the voltage on the integrating amplifier output line 188 in FIG. 1, represents the analog value coded by the logic levels of the binary signals in the lines 14 and 84 in FIG. 1.

Similarly, for an decimal value of "2" (or binary "010" coded by a logic level of binary "1" on the line S1 in FIG. 1), the capacitances 80 and 72 become charged through a circuit including the first reference voltage source 50 and the activation line 60 when the switch 62A is operated to energize the activation line 60. At the same time, the capacitor 76 becomes connected to the line 58 so as to become charged to a level dependent upon the voltage received through the pole 62B from the output line 56.

FIG. 3 indicates the capacitances which are respectively connected to the lines 60 and 58 for each analog value coded by the logic levels of the binary signals on the lines 84. As will be seen in FIG. 3, the logic levels of the binary signals introduced to the lines 84 are indicated in the first three columns in FIG. 3. The analog significance of these binary signals is shown at the top of each of these columns. The remaining columns (with the exception of the last column) indicate the state of operation of the capacitances 66 through 80 (even numbers only), these capacitances being respectively indicated in FIG. 3 by the letters "H" through "A" to correspond to the letters indicated for these capacitances in FIG. 2. The last column in FIG. 3 indicates the particular one of the capacitances to be connected to the interpolation line 58 for each decimal value coded by the logic levels of the binary signals on the lines 84.

As will be seen in FIG. 3, two diagonal lines 130 and 132 are provided. The capacitances indicated to the left of the line 130 represent those connected to the activation line 60 for the different decimal values. The capacitances isolated between the lines 130 and 132 are those which are connected to the interpolation line 58 for each analog value. These capacitances correspond to those indicated in the last column in FIG. 3. As will be seen, the capacitance connected to the interpolation line 58 for each analog value is the one next to be connected to the activation line 60 when the analog value represented by the logic levels of the binary signals coded on the lines 84 increases.

The apparatus disclosed above has certain important advantages. One of these results from the fact that the capacitance connected to the interpolation line 58 at each instant is the same one to be connected next to the activating line 60 for increasing values coded by the logic levels of the binary signals in the lines 14 and 84. Because of this, the charge delivered to the line 82 corresponding to an increase in the input digital code by one binary bit is determined by the one and the same capacitor as previously connected to the interpolation line 58. This minimizes any error which is produced in the charge signal on the line 82 in FIG. 1. These advantages enhance the monotonicity of the converter constituting this invention and help to minimize any intergral and differential linearity errors in the converter.

Another important advantage in applicant's invention is that each of the capacitances 66 through 80 (even numbers only) in the converter 12 has substantially the same layout on an integrated circuit chip and consequently the same value. This is particularly significant in view of the fact that the capacitance connected to the interpolation line 58 for each analog value also has the same value. Furthermore, the capacitances 66 through 80 (even numbers only) are individually connected to the activation line 82 for progressively increasing values As the values progressively increase, the capacitances previously connected to the line 82 remain connected to the line and additional capacitances are connected to the line. All of the features discussed in this paragraph insure that the signal on the line 82 is monotonic and that minimal transients are produced when the magnitude of the signal on the line 82 changes.

In view of the advantages discussed in the previous paragraphs, a conventional amplifier such as the integrating amplifier 180 in FIG. 1 can be used to convert to an analog voltage the charge signals from the converter 10 and the converter 12. Furthermore, the deviations allowable in the accuracy of the components of the converter 10 such as the resistance ladder formed by the resistances 34 through 48 (even numbers only) (FIG. 1) can be less stringent than in the corresponding apparatus of the prior art. For example, when the apparatus constituting this invention operates upon sixteen (16) binary bits, the converter 12 may operate upon a number of bits such as the ten (10) most significant, binary bits and the converter 10 may operate upon the remaining number of bits such as the six (6) least significant binary bits. Under such circumstances, the resistances 34 through 48 (even numbers only) in FIG. 1 may have deviations in value as high as two percent (2%) while still maintaining monotonicity of the apparatus of this invention. When deviations in value as high as two percent (2%) are allowable in components such as resistors, the resistors can be manufactured using low cost monolithic techniques while still retaining monotonicity and low integral and differential errors in the apparatus constituting this invention. It is also relatively easy to provide resistors within such limits of deviations because the resistances 34 through 48 (even numbers only) may be considered to constitute a single resistor with a number of taps.

The converter shown in FIGS. 1 and 2 and described above also has other important advantages. For example, because the converter 12 may have to convert only the ten (10) most significant bits out of a total of sixteen (16) bits to be converted, the converter can be disposed on a single integrated circuit chip. The conversion of a minimal number of bits in the converter 12 is desirable because the number of switches in the converter approximately doubles for each additional binary bit which is to be decoded by the converter.

As will be appreciated, the output on the line 82 in FIG. 1 is a charge. It is desirable to provide the output in the form of a charge rather than in the form of a current because it is easier to provide a precision charge output, particularly on an integrated circuit chip with components formed in C-MOS technology, rather than a precision current output.

A switch 182 is connected in the reset line 90 in FIG. 1 between the input and output terminals of the amplifier 180. One terminal of a capacitor 184 is connected to the input terminal of the amplifier 180 and a second terminal of the capacitor 184 is connected to the movable arm of a switch 186. One stationary contact of the switch 186 is common with the reference potential such as the ground 52 and the other stationary contact of the switch 186 is common with the output terminal of the amplifier 180 and with a line 188.

When the movable arm of the switch 182 engages the stationary contact of the switch and the movable arm of the switch 186 engages the lower stationary contact of the switch, the left and right terminals of the capacitance 184 in FIG. 1 have a voltage difference corresponding to the difference between the reference potential such as the ground 52 and the amplifier offset voltage on the line 82. Assume now that the switch 182 is opened and the movable arm of the switch 186, previously engaging the lower stationary contact of the switch, is moved upwardly to be electrically continuous with the output line 188 in FIG. 1. The potential stored across the capacitance 184 does not change under such circumstances. However, the potential on the left terminal of the capacitance 184 will be driven to the offset voltage of the amplifier 180 and the voltage on the analog output line 188 will differ from the voltage on the line 82 by the voltage previously stored in the capacitance 184. Because the voltage stored in the capacitance 184 is the offset voltage of the amplifier 180 and because this stored voltage has not changed it should be understood that the voltage on the analog output line 188 will be driven quite accurately to the reference potential such as the ground 52. The amplifier offset voltage has therefore been removed from the output line 188. This is important in insuring that the analog-to-digital converter constituting this invention will include an accurate amplification of the charge signal at the amplifier input 82.

FIG. 4 provides a simplified schematic representation of apparatus for converting the difference in amplitude between an unknown analog signal and a digital-to-analog converter signal into an analog output having a variable sensitivity. In the apparatus shown in FIG. 4, the unknown analog signal to be converted is provided on a line 200. This analog signal may be converted to a charge signal by a bank of energy storage members such as capacitors 202. The charge in the capacitors 202 is introduced to a line 204 when the arm of a switch 203 is moved to a contact 203A. When the arm of the switch 203 is moved from the contact 203A continuous with the line 200 to a contact 203B continuous with a line 201, the line 201 is connected to a reference potential such as the ground 52 to discharge the capacitors 202.

The charge signal in the line 204 is combined with the charge signal provided on a line 206 from embodiments corresponding to the networks 10 and 12 in FIG. 1. The embodiments corresponding to the networks 10 and 12 are shown in FIG. 4 as being combined in a D-A converter block indicated by broken lines at 208. As will be appreciated, other types of converters than the embodiments corresponding to the converters 10 and 12 may also be used in the converter 208.

An amplifier 210 (FIG. 4) corresponding to the amplifier 180 in FIG. 1 produces on its output terminal a signal having an amplitude proportional to the difference between the charge outputs from the networks 202 and 208. The amplifier 210 may have an adjustable gain in the charge input relative to the voltage output. The gain of the amplifier 210 is adjusted by operating the binary coded gain control bus 278 to select the number of capacitors connected in a network 217 to an output line 218. The network 217 and the gain control bus 278 may be constructed and operated in a manner identical to the network 12 and the control bus 84 in FIG. 1 for the most significant binary digits.

A reset of the offset compensation in the network 217 and the amplifier 210 may be provided by switches 212 and 216. The switch 212 is connected between the input and output terminals of the amplifier 210 in a manner similar to the switch 182 in FIG. 1. Capacitors generally indicated at 214 in FIG. 4 correspond to the capacitors 66 to 80 (even numbers only) in FIG. 1. The switch 216 corresponds to the switch 86 in FIG. 1. The output from the amplifier 210, is introduced to a line 218. The line 218 therefore provides the variable sensitivity analog output (Vout) of the system shown in FIG. 4.

The system including the network 217, the amplifier 210 and the switches 212 and 216 is designated by a block 280 which is shown in broken lines in FIG. 5.

Additional stages in the converter constituting this invention are shown in block form in FIG. 5. In the embodiment shown in FIG. 5, the block 280 includes a D-A converter 208 (shown in broken lines) which in turn includes additional embodiments corresponding to the networks 10 and 12 in FIG. 1. The network 10 in FIG. 5 is responsive to binary signals representing the binary bits of least significance and the network 12 is responsive to the binary signals representing the binary bits of increased significance.

The embodiments corresponding to the networks 10 and 12 in FIG. 5 respectively receive the binary signals through control latch arrangements 234 and 236 from an adder 240. The control latch arrangements control the operation of the switches in the embodiments of the networks 10 and 12 in FIG. 5 in accordance with the logic levels of the binary signals of the adder 240. The signals passing through the control latches 234 and 236 are introduced to a "B" input 242 of the adder 240. An "A" input 244 to the adder 240 is also provided for receiving a sign bit through a line 245 from a decoder read-only-memory (ROM) 248 and for also receiving binary data output through a bus 247 from a shift register 246. The signals from the inputs 242 and 244 are added in the adder 240 in each cycle of operation of the analog-to-digital converter constituting this invention to provide binary coded signals for the control of the embodiments corresponding to the networks 10 and 12. These signals also comprise the A-D converter output word. These signals are produced on buses.

The decoder ROM 248 is included in a flash converter generally indicated in broken lines at 250. The flash converter 250 includes comparators and gates 252. As will be discussed in detail subsequently, the flash converter 250 produces a plurality of signals providing in binary coded form an indication of the difference between the amplitudes of the signals on the lines 204 and 206 in FIG. 4.

The data output on the line 247 is loaded into the shift register 246 by a signal on a load control line 256. The signal on the load control line 256 is generated by control logic 290. The data in the shift register 246 is shifted right (reduced in binary significance) each time that a shift clock pulse occurs on a shift clock line 258. During each such shift right, the sign bit on the line 245 is present at the serial data input D of the shift register. This input determines the state of the most significant bit in the shift register after each shift clock pulse. The shifted output is routed to the input 244 of the adder 240 through the shift register data output bus 247.

Shift clock pulses on a line 258 are generated by an "and" network 260 having input terminals connected to (a) a logical comparator 262 through an inverter 263, (b) a clock line 264 and (c) a shift gate line 266. The line 264 provides clock signals from the control logic 290. The line 266 provides, in each successive cycle of comparing the amplitude of the charge signal on the line 206 to the amplitude of the charge signal on the line 204, a gating signal controlling the particular time that the "and" network 260 passes the clock signals on the line 264 to produce the shift clock signals on the line 258.

A logical comparator 262 compares the count in a shift clock counter 270 with the count indicated by signals in an adder 272. The adder 272 receives the signals from a pair of inputs 274 and 276. The input 274 (indicated as B input in FIG. 5) is in turn connected to receive the signals on a gain control bus 279. These signals represent the logarithm, to a base of two (2) ($log_2$), of the increase in gain (from a gain of one [1]) provided in the amplifier 210. The A and B inputs to the adder 272 are different from the A and B inputs to the adder 240.

The input 276 (indicated as an A input in FIG. 5) receives signals from a shift-right (SAR) counter 281. The counter 281 is reset by a pulse on a reset line 286 at the beginning of each conversion cycle. This reset pulse is generated by the control logic 290. During the later approximation cycles of the converter, this counter is counted up or incremented by a count of one. A SAR counter pulse is also generated on a line 284 by the control logic 290 to increment the count in the counter 281. The timing of each incrementing pulse on the line 284 is generally indicated in the timing diagram of FIG. 8.

The control logic 290 may be realized by an assortment of conventional random logic such as gates and flip-flops or the signals may be generated by a combination of general purpose microprocessor-based integrated circuit chip sets. The generation of such conventional random logic in the control logic 290 is believed to be well known in the art.

Figure 6:
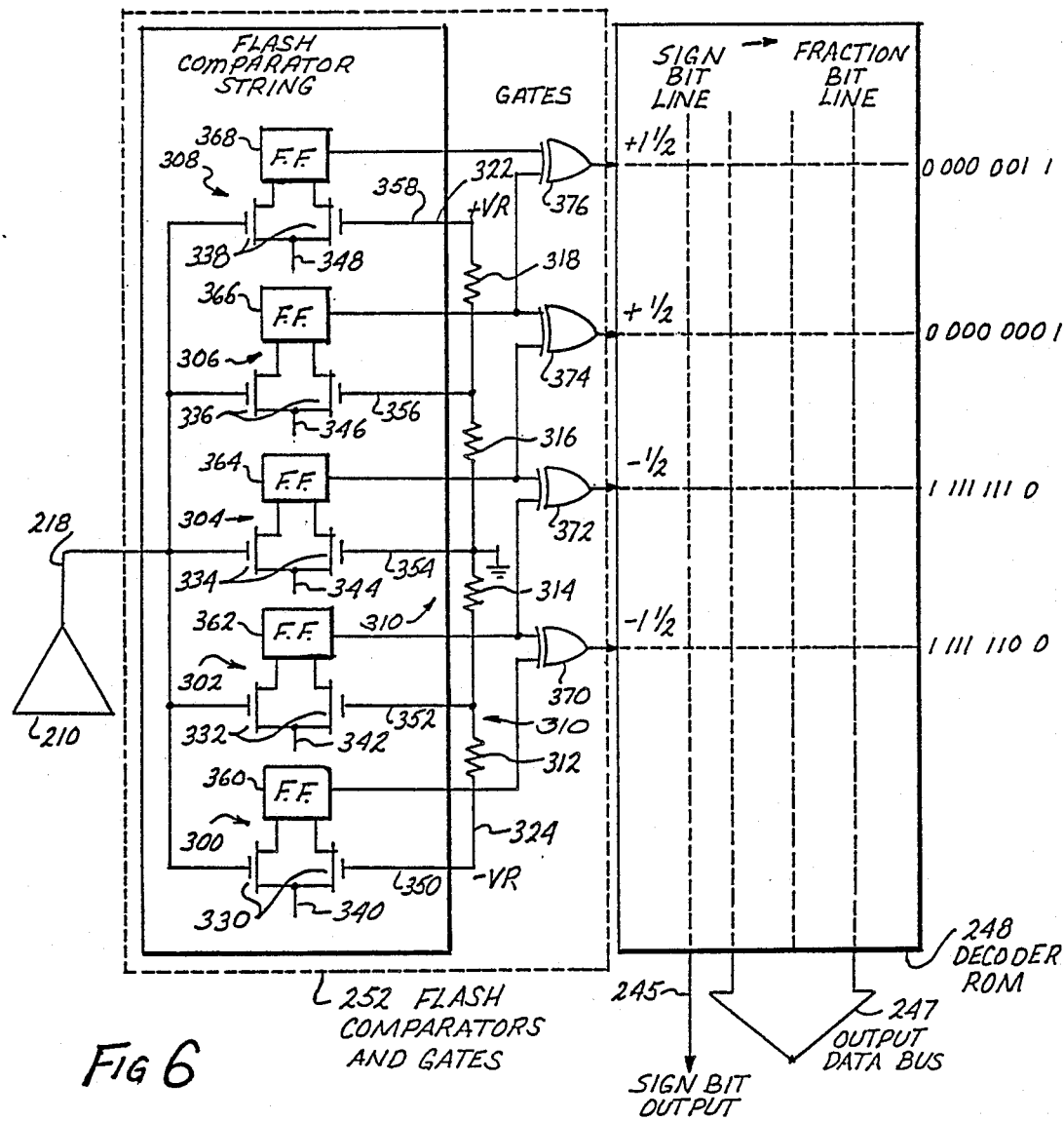
FIG. 6 is a block diagram schematically indicating the details of the flash converter portion of the system for converting the amplitude of the analog signal to binary coded indications.

The flash converter 250 is shown in detail in FIG. 6. As will be seen, the flash converter 250 is responsive to the signals from the amplifier 210 in FIGS. 4 and 5. The flash converter 250 includes a plurality of comparators such as comparators generally indicated at 300, 302, 304, 306 and 308. These comparators are included in the comparators and gates schematically illustrated at 252 in FIG. 5. Each of the comparators 300, 302, 304, 306 and 308 is responsive to the signals from the amplifier 210 and is also responsive to the voltage on an individual one of the terminals from a ladder network generally indicated at 310 The ladder network 310 is formed from a plurality of resistances 312, 314, 316 and 318 connected in series between a voltage supply 322 and a voltage supply 324. The voltage supply 322 provides a positive and accurate voltage of a constant magnitude such as +2.048 volts and the voltage supply 324 provides a negative and accurate voltage of the same constant magnitude as the voltage supply 322.

The signal from the amplifier 210 is introduced to the left input terminals of differential MOS transistor pairs 330, 332, 334, 336 and 338 which are respectively included in the comparators 300, 302, 304, 306 and 308. The right input terminals of the transistor pairs 330, 332, 334, 336 and 338 are respectively biased by the voltages on lines 350, 352, 354, 356 and 356. The lines 350, 352, 354, 356 and 358 are respectively connected to the voltage source 324, the terminal common to the resistances 312 and 314, the terminal common to the resistances 314 and 316, the terminal common to the resistances 316 and 318 and the voltage source 322. Substantially identical bias currents are applied to the common source connections 340, 342, 344, 346 and 348 of the differential transistor pairs 330, 332, 334, 336 and 338.

The output terminals of the left transistors of pairs 330, 332, 334, 336 and 338 are respectively connected to first input terminals of current-steered flip-flops 360, 362, 364, 366 and 368. Connections are respectively made from the output terminals of the right transistors of the pairs 330, 332, 334, 336 and 338 to second input terminals of the current-steered flip-flops 360, 362, 364, 366 and 368. Connections are made as follows: (a) from first output terminals of the flip-flops 360 and 362 to the input terminals of an "exclusive or" network 370, (b) from first output terminals of the flip-flops 362 and 364 to the input terminals of an "exclusive or" network 372, (c) from the first output terminals of the flip-flops 364 and 366 to the input terminals of an "exclusive or" network 374 and (d) from the first output terminals of the flip-flops 366 and 368 to the input terminals of an "exclusive or" networks 376.

The transistor pairs 330, 332, 334, 336 and 338 operate as differential amplifiers, particularly since the transistors in each pair are commonly biased. By way of illustration, the first output of the flip-flop 364 may be triggered to a true state when the amplitude of the signal from the amplifier 210 is greater than the voltage on the line 354 common to the resistances 314 and 316. Similarly, the flip-flop 364 may be triggered to a false state when the amplitude of the signal from the amplifier 210 on the line 218 is less than the voltage on the line 354 common to the resistances 314 and 316.

As will be seen, individual first outputs of the flip-flops 360, 362, 364, 366 and 368 in FIG. 6 have true states of operation when the output from the amplifier 210 in FIGS. 4, 5 and 6 exceeds the incremental voltage introduced from the ladder network 310 to the right side of transistor pairs 330, 332, 334, 336 and 338 associated with such individual flip-flops. However, at some point in the progression of the flip-flops 360, 362, 364, 366 and 368, the flip-flops may have a false state at their first output. This occurs when the output from the amplifier 210 in FIGS. 4, 5 and 6 is less than the incremental voltage introduced from the ladder network 310 to the right side of the transistor pairs 330, 332, 334, 336 and 338. For example, for a particular output voltage from the amplifier 210, the first output of the flip-flops 360, 362 and 364 may have a true state but the second outputs of the flip-flops 366 and 368 may have a false state. As a result, only the "exclusive or" network 374 has an output which is in the true state. This indicates that the voltage on the line 218 is approximately between the voltages on the lines 354 and 356.

The single "exclusive or" network in the true state (374 for example activates a corresponding input line of the decoder read-only-memory (ROM) shown as a block 348 in FIG. 6. This decoder ROM is constructed in a manner well known in the art. The decoder ROM 348 provides, in response to a single drive input, a sequence of binary signals each having first and second logic levels respectively coding for binary "1" and binary "0". These signals appear on the line 245 providing the sign bit output 245 and on the bus 247 providing the data output 247. These signals are illustrated in FIG. 7.

The first signal in each sequence (FIG. 7) represents the polarity of the output from the activate one of the exclusive "or" networks 370, 372, 374 and 376 a binary "0" representing a positive polarity and a binary "1" representing a negative polarity. The first signal in the sequence appears at the left end of the sequence. This signal indicates whether the voltage on the line 218 in FIG. 6 is greater than the voltage on the individual ones of the lines 350, 352, 354, 356 and 358 or vice versa. This data is useful in determining whether the charge output from the D-A converter 208 in FIG. 5) is greater or less than the charge output from the network 202, this charge output corresponding to the amplitude of the unknown input signal on the line 200. The successive signals in each sequence identify in binary coded form the median value of the voltage increment in the ladder network 310 corresponding to the selected one of the "exclusive or" networks 370, 372, 374 and 376.

Figure 7:
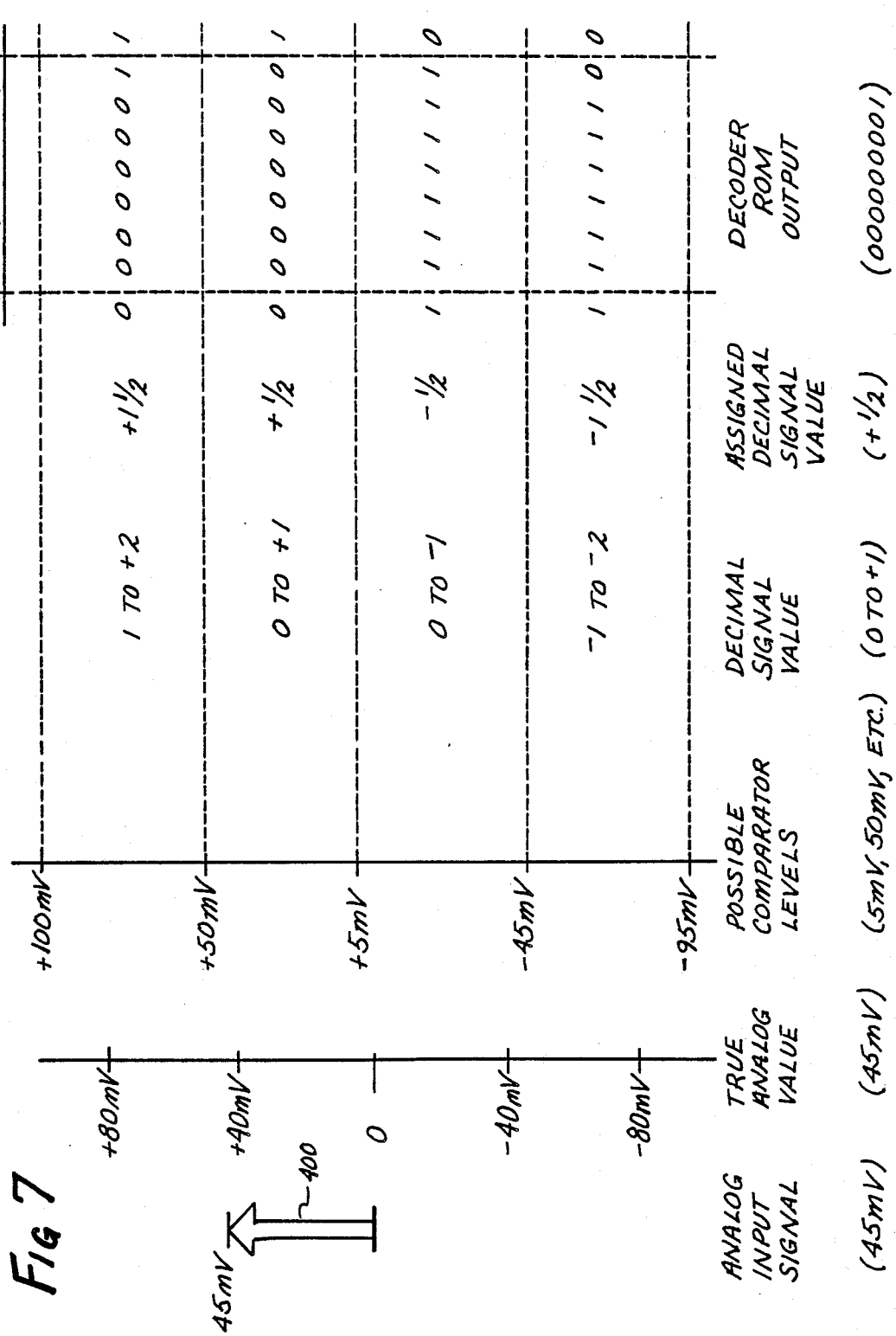
FIG. 7 illustrates an example of the type of binary signals produced by the flash converter shown in FIG. 6.

The coding of the different bits in the binary word sequences of FIG. 7 may be provided in a conventional manner. For example, a word may have a coding of "000000011". The binary "0" at the left end of the sequence indicates a positive polarity for the analog value coded by the binary sequence. The next seven (7) binary bits toward the right end of the sequence indicate a decimal value of "3". The least significant bit in the sequence is at the right and has a fractional value of ½. The total decimal value of the signal is accordingly +1.5. Similarly, a sequence of "111111100" indicates a negative value with a magnitude of "1½" (−1.5). The binary "1" at the left end of the sequence indicates a negative polarity and the seven (7) bits at the right end of the sequence indicate a decimal magnitude of "1" in "binary ones complement" form. The binary bit at the right end of the sequence indicates a magnitude of one half (½) in "binary ones complement" form. The "binary ones complement" form is well known in the art.

FIG. 7 is a chart illustrating the operation of the decoder ROM 248 in FIG. 6. The first column in FIG. 7 indicates that the value of the analog input signal on the line 204 in FIG. 5 increases in an upward direction as indicated by an arrow 400. It further indicates the true value of the analog signal in the second (2d) column of FIG. 6. As will be seen, the true analog value is shown as increasing by increments of forty (40) millivolts. The third (3d) column in FIG. 7 indicates the incremental voltage levels at which each of the successive "exclusive or" networks 370, 372, 374 and 376 in FIG. 6 becomes activated. The fourth (4th) column in FIG. 7 indicates the range of the decimal values of the binary indications provided in the decoder ROM 248 for the outputs from each of the "exclusive or" networks 370, 372, 374 and 376. The fifth (5th) column in FIG. 7 indicates the decimal values in FIG. 7 when a positive value of one half (+½) is added to the values shown in the fourth (4th) column of FIG. 7. The sixth (6th) column in FIG. 7 illustrates in binary coded form the decimal values shown in the fifth (5th) column.

In the sequence of binary bits shown in the sixth (6th) column of FIG. 7, the bit at the right end of the sequence always increases the value in the selected voltage increment of FIG. 7 by a value of one half (½) of an increment. Thus, for example, the indication in FIG. 7 of a decimal signal value of 0 to 1 is decoded to a positive value with a magnitude of one half (½). For example, when the actual value of the amplitude of the signal on the line 218 in FIG. 6 is forty five millivolt (45mV), it may fall in the upper half of the increment represented by the resistance 316 in FIG. 7. The addition of the decimal value of one half (½) to the increment value of 0 will cause this amplitude difference to be reduced in the subsequent operation of the converter by a voltage of one half (½) times the nominal forty millivolt (40mV) increment value, or nominally twenty millivolt (20mV). The next operation will therefore result in an output of 45mV − 20mV = 25mV and will always fall within the voltage difference just above or below the ground voltage on the line 354 in FIG. 6. This range is represented by the resistances 314 and 316. However, if the actual value of the amplitude on the line 218 in FIG. 7 occurs in the lower half of the increment represented by the resistance 316 (5mV for example), the next operation of the converter will produce a difference of 5mV − 20mV = −15mV. This difference will fall within the increment represented by the resistance 314. In this way, the system of FIG. 6 is always able to drive the voltage on the line 218 in FIGS. 4 and 6 to an amplitude within the increment just above or below ground. This amplitude is within the increment represented by the resistors 314 and 316 in the resistance ladder 310.

The data and sign bit outputs from the decoder ROM 248 are respectively introduced through the buses 247 and 245 to the shift register 246. When there is no increase in gain in the amplifier 210 in FIG. 6, the data in the shift register 246 is not shifted and the signals are introduced to the A input 244 of the adder 240 upon the occurrence of the load command signal in the line 256. The binary value of the A input 244 from the shift register 246 are then added in the adder 240 to the binary value of the control signals stored at the B input 242 of the adder 240. The result of the addition in the adder 240 represents an updated approximation in binary coded form of the unknown input signal charge produced on the line 204. The result of this addition is introduced to the converter 208.

The signals produced in the adder 240 are introduced through the control latches 234 and 236 to the embodiments corresponding to the converters 10 and 12 to obtain a charge output on the line 206. This charge output in the line 206 will more closely cancel (and therefore more closely approximate) the charge produced on the line 204 by the unknown input signal than the charge output previously produced on the line 206. The signals passing through the control latches 234 and 236 are also introduced to the B input 242 of the adder 240 for use in the next cycle of approximation.

The system described above may provide a plurality of successive approximations in the D-A converter 208 of the charge output corresponding to the amplitude of the unknown analog signal on the line 204. In these successive approximations, the value of the logic levels of the binary signals from the adder 240 progressively approach a binary value corresponding to the amplitude of the unknown charge signal on the line 204. As previously described, this successive approximation to the amplitude of the charge signal on the line 204 is facilitated by the addition of the one half (½) increment to the binary error signals provided by the decoder ROM 248. This increment of one half (½) is introduced to the shift register 246 through the line 247 in each successive approximation.

The system constituting this invention is able to provide enhanced approximations of the amplitude of the unknown input signal on the line 204 by increasing the gain of the amplifier 210 in at least one of the successive approximations. This may be accomplished by actually changing the value of the capacitance connected from the output of the amplifier 210 to the input to the network converter 217 in FIG. 4. As previously described, the network converter 217 in FIG. 4 may correspond to an embodiment of the network 12 in FIG. 1.

The value of the capacitance 214 in FIG. 4 may be varied by controlling the logic levels of different binary signals on the gain control bus 278 from the control logic 290 in FIG. 7. These different binary signals correspond to the signals $S_0$, $S_1$ and $S_2$ in FIG. 1. Decimal values of increases in gain (from 1 to 64) are shown for the bus 278 in the timing diagram of FIG. 8.

FIG. 8 shows the time relationship of a number of important signals in performing a succession of approximations to the input signal on the line 204 in FIGS. 4, 5 and 6. FIG. 8 shows a number of columns of information. The signals in each column in FIG. 8 indicate a successive one of the approximations performed by the system constituting this invention. The first (1st) approximation provides an indication having an accuracy to seven (7) binary bits. The second approximation provides an indication having an accuracy of seven (7) plus six (6) binary bits-in other words, an accuracy of thirteen (13) binary bits. Each of the third (3rd), fourth (4th) and fifth (5th) successive approximations respectively provides an accuracy to fourteen (14), fifteen (15) and sixteen (16) binary bits.

The first row in FIG. 8 illustrates signals 406 produced in the load line 256 in FIG. 5. These signals provide for the loading into the shift register 246 of the signals from the decoder ROM 248. Signals 408 in the second row in FIG. 8 provide a time during which the signals in the shift register 246 can be shifted to compensate for the gain in the amplifier 210. For example, if the gain in the amplifier 210 is increased by a factor of sixty four (64) (corresponding to $2^6$), the signals in the shift register 246 should be shifted downwardly in binary significance by six (6) binary bits before such signals are introduced to the input 244 in the adder 240.

The shift in the signals in the shift register 246 is synchronized with the production of clock signals indicated at 410 in the third row of FIG. 8. The duration of the clock signals tends to be overextended in FIG. 8 to illustrate the clock signals clearly. The fourth row of FIG. 8 indicates the shift made in each successive approximation in the binary information in the shift register 246 when this binary information is introduced to the input 244 of the adder 240. For example, no shift is provided in the first one of the successive approximations in FIG. 8, but shifts through six (6) binary bits (corresponding to a gain of 64 in the amplifier 210) are made in each of the next four (4) approximations. These binary bits are indicated at 412 in FIG. 8. These gains by a factor of sixty four (64) in the amplifier 210 are indicated in the fifth (5th) row of FIG. 8 for each of the second (2d) through fifth (5th) successive approximations. The last row in FIG. 8 indicates signals 414 which pass through the line 284 in FIG. 5 for counting by the shift right counter 281.

When the gain in the amplifier 210 (FIG. 4, 5 and 6) is increased, the binary significance of the data output from the flash converter 250 (FIG. 5 and all of FIG. 6) is correspondingly increased. The shift register 246 receives a corresponding increase in the value represented by the binary signals such as the signals shown in FIG. 7. To compensate for this increase in the binary value of the input to the shift register 246, the signals in the shift register are shifted right, or reduced in binary significance, by a factor corresponding to the increase in the gain in the amplifier 210. The number of shift right pulses (412 in FIG. 8) corresponds to the logarithm to the base 2 of the increase in gain in the amplifier 210. For example, in a particular cycle of approximation, the gain in the amplifier 210 may be increased by a value of sixty four (64). To compensate for this, the values in the shift register 246 are shifted downwardly in binary significance by six (6) binary digits (bits) with the number of shift clock pulses on the line 258 being equal to $\log_2(64) = 6$. In other words, each of the bits in the shift register 246 (including the sign bit present at the D input) is shifted to the right (to a position of decreased significance) by six (6) binary bits. All of these operations may be provided and synchronized under the control of the control logic 290.

The increase in the gain of the amplifier 210 may be provided through a number of successive approximations. In one or more of these successive approximations, the gain of the amplifier 210 may be successively increased. For example, in successive approximations, the gain of the amplifier 208 may be increased by factors of 4, 32, 128, etc. This means that the shift clock line 258 introduces pulses to the shift register 246 to shift the bits in the shift register to the right (downwardly in binary significance) by 2, 5, 7, etc. binary positions in such successive approximations. Actually, however, a first approximation may be provided without any increase in the gain of the amplifier 210 and a second approximation may then be provided with an increase in the gain of this amplifier by a factor such as sixty four (64). Under such circumstances, the signals in the shift register 246 are shifted right (downwardly) by six (6) binary bits. This actually constitutes the preferred mode of operation.

The shift clock counter 270 in FIG. 5 counts the number of shift pulses transmitted on the line 258 to the shift register 246. The logic circuit including the comparator 262, the inverter 263 and the gate 260 function to ensure that the correct number of shift pulses are transmitted. This number is always the same as the binary number which is present at the output of the adder 272. This number in the adder 272 is the sum of the amplifier log gain at the B input 274 and the additional shift right count from the counter 281. This count is present at the A input 276 to the adder 272.

When the count in the counter 270 is less than the output count in the adder 272, the comparator 262 produces a false or low signal. This signal is inverted by the inverter 263, thereby causing a true output signal to be produced at one of the input terminals of the gate 260. When the shift time signal is true on the line 266 at a particular time in each successive approximation, the and gate 260 passes shift clock signals to the shift clock input of the shift register 246. These clock pulses also are counted in the counter 270. However, when the count in the adder 272 equals the count in the counter 270, the comparator 262 produces a true output signal. This signal is inverted by the inverter 263 and the resulting false signal output prevents the and gate 260 from passing any additional clock signals in a given shift time interval such as shown at 408 in FIG. 8. At the end of the shift time interval such as shown at 408 in FIG. 8, the inverted shift time signal causes the counter 270 to be reset at the reset input 271.

By increasing the gain in the amplifier 210 in at least one of the successive approximations, the difference between the amplitudes of the charge output from the D-A converter 208 and the input signal network 204 is amplified in such approximation(s) so that an enhanced accuracy can be provided in the binary signals produced by the flash converter 250 (FIG. 5 and all of FIG. 6). The flash converter 250 therefore can provide a multiple-bit estimate of the charge difference while prior art successive approximation systems using just one comparator could provide only a single bit estimate of this difference in each successive approximation. Thus, by comparison with the prior art, the charge difference is estimated with enhanced accuracy even while using a minimal number of successive approximations.

After the last one of the successive approximations has been provided in which the gain in the amplifier 210 is increased from the previous approximation, at least one successive approximation may be provided in which the gain of the amplifier 210 is maintained at the same increased gain. This procedure allows the same comparator (always the comparator 304 in FIG. 6) to determine the final approximation between the D-A converter output at the line 206 and the unknown input signal charge output at the line 204.

Because the same comparator (304) is always used in the final approximation, an important advantage over prior art flash converters results. These prior art converters have been subject to differential linearity degradation by non-uniformities in the incremental voltage difference between such comparators. Because the converter constituting this invention always uses the same comparator for the last approximation, the differential linearity depends primarily on the differential linearity of the D-A converter 208 (FIGS. 4 and 5). By constructing the converter 208 as disclosed and claimed in co-pending application Ser. No. 755,170, excellent differential linearity is assured to a range well beyond sixteen (16) bits.

The number of successive approximations at such constant increased gain may be pre-set in the control logic 290. After the first successive approximation with a constant gain, the count in the counter 281 is increased by an integer in subsequent approximations. This count is introduced through the A input 276 to the adder 272 in FIG. 5 and is compared in the comparator 262 with the count in the counter 270. When the count in the counter 270 is increased, the number of shift clock pulses counted by the shift clock counter 270 also is allowed to increase. In each of these successive approximations, the bit corresponding to the comparator decision is therefore shifted right (decreased in significance) one more bit in the shift register 246. Therefore, in each of these successive approximations, the difference between the amplitudes of the D-A converter 208 and the unknown analog input signal on the line 204 should have decreased by at least one half ($\frac{1}{2}$) from the difference in the previous one of the successive approximations.

FIG. 8 illustrates the operation of the shift register 246 in successive approximations. As shown in FIG. 8, the result introduced into the shift register from the flash comparator 250 for each of the successive approximations is shifted in synchronism with the signals 406 on the line 256 in FIG. 5. In the first of these successive approximations, no data is shifted in the shift register 246 because no increase in gain is provided in the amplifier 210. In the next one of these successive approximations, the binary signals are shifted in the shift register 246 through six (6) binary bits during the time period 408 because the gain of the amplifier 210 is increased by a factor of sixty four (64). As will be seen in FIG. 8, the time period occurs immediately after the load pulse 406 in each of these successive approximations. The flash result loaded in the shift register 246 at the time 408 in FIG. 8 estimates the analog equivalent of first seven (7) binary bits. The next flash result estimates the analog equivalent of six (6) additional bits because of the increase in gain of sixty four (64) in the amplifier 210. Therefore, the analog equivalent of thirteen (13) binary bits have been estimated after only two (2) approximations.

After, a number of successive approximations have occurred in the flash converter 250, the difference between the amplitudes of the signal from the D-A converter 208 and the unknown input signal from the network 202 should have decreased to a relatively low value. This value should be so low that the output from the amplifier 210 should be in the incremental voltage range represented by the voltage drop across the resistances 314 and 316 in FIG. 6 if no further increase in the gain of the amplifier 210 is produced. Since such difference is relatively low, it would be desirable to further increase the precision in successive approximations. This can be accomplished by providing one of the comparators (304 in FIG. 6) in the flash converter 250 with more precision than the other comparators in the flash converter or by providing an additional comparator with enhanced precision. For example, the MOS transistors 334 in the comparator 304 can be constructed by using layout techniques resulting in more precision than the corresponding transistors in the comparators 300, 302, 306 and 308. This causes the successive approximations for small amplitudes of the signals on the line 218 to be quite accurate.

The third approximation in FIG. 8 re-estimates the thirteenth (13th) binary bit. The next (or fourth) approximation estimates the fourteenth (14th) binary bit and the next two (2) approximations respectively estimate the fifteenth (15th) and sixteenth (16th) binary bits. Thus, only six (6) estimates are required instead of the sixteen (16) normally required for a sixteen (16) bit result.

In this way, the A-D output word on the output bus 299 provides an accurate indication in binary coded form of the amplitude of the unknown input signal on the line 200 in a minimal number of successive approximations. The accuracy and reliability of this result are obtained in part because of the operation of the system constituting this invention and are also obtained in part because of the accuracy and reliability of the D-A converter 208. For example, the converter 208 can be constructed to convert, with extremely high integral and differential linearities, binary data of at least sixteen (16) binary bits into an analog signal and to estimate the unknown analog input signal on the line 200 in as few as six (6) successive approximations.

In a second embodiment of the invention, the charge output from the novel D-A converter (208 in FIG. 4) is compared with the charge output of the network 202 (resulting from the unknown analog input signal on the line 200) by setting the amplifier 210 to its maximum gain (no capacitance from output to input). Under such circumstances, the amplifier 210 functions as a simple comparator. The output from the amplifier 210 may then be connected to simple successive approximation control logic as commonly found in successive approximation A-D converters of the prior art. This embodiment will not have the significant speed advantage of the first embodiment, but it will provide a significant improvement in differential linearity and monotonicity as a result of the use of the D-A converter 208 disclosed and claimed in co-pending application Ser. No. 755.170.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In combination for converting between analog values and binary coded values,
   means for providing a signal having an amplitude representing the analog value,
   a plurality of switches each having first and second states of operation,
   means for connecting the switches in sub-sets each having an individual binary significance, the switches in the sub-sets being connected in a repetitive array,
   a plurality of output members each constructed to store energy,
   energizing means for the output members,
   means for connecting the output members to the switches in the repetitive array and to the energizing means to obtain a storage of energy in the output members in accordance with the operation of the switches in the repetitive array in the first and second states,
   means responsive to the analog signal for storing energy representative of the amplitude of such signal,
   comparator means responsive to the energy stored in the output members and in the analog storage means for comparing the magnitudes of the energy stored in such means and for producing a signal having an amplitude representing any difference in any such comparison,
   means responsive to the signals from the comparator means for storing in binary coded form signals having logic levels cumulatively representing the amplitude of the signal from the comparator means, and
   means responsive to the signals from the last mentioned storage means for activating the switches in the different sub-sets in accordance with the logic levels of such signals to provide a binary indication in such switches of the amplitude of the signal from the comparator means.

2. In a combination as set forth in claim 1,
   a first line,
   the switches in the repetitive array and the output members being connected to the first line to provide, for increasing analog values coded by the amplitude of the analog signal, for the retention of connections to the first line of output members previously connected to the first line and for the connection to the first line of additional output members in accordance with such increasing analog values,
   a second line connected in the repetitive array to the next one of the output members to be connected to the first line for progressively increasing analog values coded by the analog signal,
   converting means having a lower binary significance than that represented by the output members, the converting means being connected to the second line to produce a voltage on the second line in accordance with the operation of the converting means,
   means for providing for at least a pair of successive approximations, and
   the activating means activating the switches and the converting means in the first approximation to provide a first approximation of the amplitude of the signal from the comparator means and activating the switches and the converting means in the second approximation to provide a second approximation of the amplitude of the signal from the comparator means,
   the output members being operative to store the sums of the first and second approximations provided by the activating means, each of the output members having substantially the same value as the other output members.

3. In a combination as set forth in claim 2,
   the comparator means including a plurality of comparators connected in a voltage-dividing network to digitize any energy difference sensed by the comparator means between the energy stored in the output members and the energy stored by the energy storage means responsive to the analog signal, and
   the activating means including third means for providing for a third approximation, and
   the output members being operative to store the sum of the first, second and third approximations.

4. In a combination as set forth in claim 2,
   the comparator means having an adjustable gain, and
   means operative in at least one of the approximations for increasing the gain of the comparator means in comparing the amplitude of the signal from the signal means and the amplitude of the energy stored in the output members.

5. In combinations for converting between analog values and binary coded values,
   first converting means for producing a first output signal having an amplitude representing binary values of relatively low binary significance,
   second converting means including a plurality of stages connected in a repetitive array for producing a second output signal having an amplitude representing binary values of higher binary significance than that provided by the first converting means,
   the first and second converting means being operatively coupled to each other to produce a resultant signal having an amplitude representing the combination of the amplitudes of the first and second output signals,
   means for providing a signal having an amplitude representing the analog value,
   means responsive to the signal representing the analog value and the resultant signal for comparing the amplitudes of such signals to produce a signal having an amplitude representing any difference between the amplitudes of the compared signals,
   means for providing for first and second successive approximations, and means responsive in each of the successive approximations to the amplitude of the difference signal for introducing the signals from the comparing means to the first and second converting means to adjust cumulatively the production of the resultant signal by the first and second converting means in accordance with the amplitude of such difference signal in each such approximation.

6. In a combination as set forth in claim 5, the second converting means including a plurality of output members constructed to store energy and connected to the repetitive array to store energy, for progressively increasing analog values coded by the amplitude of the analog signals, in the ones of the output members previously providing a storage of energy contributing to the production of the second output signal and to store energy in additional ones of the output members contributing to the production of the second output signal and being further connected to the repetitive array to store, in a particular one of the output members, energy representative of the output signal from the first converting means, the particular output member being the one next to be included in the output members contributing to the production of the second output signals for progressively increasing values coded by the amplitude of the analog signal.

7. In a combination as set forth in claim 5, the approximation providing means also providing for a third approximation, and means for adjusting the gain in the comparison by the comparing means to the analog signal and the resultant signal in at least one of the first, second and third approximations.

8. In a combination as set forth in claim 5, means for providing a reference voltage, means for providing a ladder network providing progressive portions of the reference voltage, and flash comparator means responsive to the amplitude of the signal from the comparing means and the voltages in the ladder network for providing an indication of the amplitude of the signal from the comparing means.

9. In combination for converting between analog values and binary coded values, first converting means for producing a first output signal having an amplitude representing binary values of relatively low binary significance, second converting means for producing a second output signal having an amplitude representing binary values of higher binary significance than that provided by the first converting means, the first and second converting means being operatively coupled to each other to produce a resultant signal having an amplitude representing the combination of the amplitudes of the first and second output signals, means for providing a signal having an amplitude representing the analog value, means responsive to the analog signal and the resultant signal for comparing the amplitudes of such signals to produce a signal having an amplitude representing any difference between the compared signals, means for providing first and second successive approximations, and means responsive in each of the successive approximations to the amplitude of the difference signal for introducing the signals from the comparing means to the first and second converting means to adjust the operation of the first and second converting means in accordance with the amplitude of such difference signal in such approximation, means for providing a reference voltage, means for providing a ladder network providing progressive portions of the reference voltage, flash comparator means responsive to the amplitude of the signal from the comparing means and the voltages in the ladder network for providing an indication of the amplitude of the signal from the comparing means, the adjusting means being responsive in each approximation to the amplitude of the signal from the flash comparator means for adjusting the operation of the first and second converting means in accordance with the amplitude of such difference signal in such approximation, the approximation means also providing for a third approximation, the flash comparator means including first flash comparators and a particular flash comparator, means operative to activate the particular flash comparator in the third approximation to indicate the relative amplitudes of the analog signal and the resultant signal, means for adjusting the gain of the comparing means in at least one of the successive approximations, and means for adjusting the binary significance of the signals introduced to the first and second converting means from the comparing means in accordance with the adjustment in the gain of the comparing means.

10. In a combination as set forth in claim 9, means responsive to the gain of the comparing means for producing an inverse adjustment in the indication of the amplitude of the signal from the comparing means.

11. In combination for converting between analog values and binary coded values, first means for providing a first signal having an amplitude representing the analog value, means including a plurality of stages connected in a repetitive array for providing a conversion between binary coded and analog values to produce a second signal representing the analog value, the conversion means being constructed to produce a monotonic conversion regardless of the analog values, and the changes in the analog values, being converted, means for comparing the analog values represented by the signals from the first means and the conversion means to produce a signal having an amplitude representing the difference between such analog values, means responsive to the amplitude of the difference signal for storing energy representative of such difference, means responsive to the stored energy for adjusting the response of the conversion means to minimize any difference in the amplitudes of the signals introduced to the comparing means, and means for activating the first means, the conversion means, the comparing means, the energy-storing means and the adjusting means to obtain a plurality of successive approximations in which the signal from the conversion means progressively approaches the analog value.

12. In a combination as set forth in claim 11,
means responsive in each of the successive approximations to the amplitude of the signal from the first means for storing energy representative of the amplitude of such signal, and
means responsive in each of the successive approximations to the amplitude of the signal from the conversion means for storing energy representative of the amplitude of such signal,
the comparing means being responsive to the energy stored in the last two mentioned means to produce the difference signal,
means for providing a reference voltage, and
means for providing progressive portions of such reference voltage,
the comparing means including flash comparator means for comparing the amplitude of the difference voltage and the progressive portions of the reference voltage in each of the successive approximations to produce binary indications of the amplitude of the difference signal,
the adjusting means being responsive to the binary indications of the amplitude of the difference signal in each of the successive approximations for adjusting the response of the conversion means to minimize any difference in the amplitudes of the signals introduced to the comparing means.

13. In a combination as set forth in claim 12,
the adjusting means including:
second means for converting the amplitude of the difference signal in each of the successive approximations to a plurality of binary signals each having an individually weighted binary significance and each having first and second logic levels respectively coding for binary "1" and binary "0", the adjusting means being responsive in each of the successive approximations to the logic levels of the binary signals for adjusting the response of the conversion means to minimize any difference in the amplitudes of the signals introduced to the comparing means.

14. In a combination as set forth in claim 13,
the converting means including a plurality of output members each constructed to store energy and also including a plurality of switches each having conductive and non-conductive states, the switches being disposed in sub-sets each responsive to the logic levels of an individual one of the binary signals, the switches being connected in the repetitive array to provide, for progressively increasing analog values, for the storage of energy in the output members previously storing energy and for the storage of energy in additional ones of the output members in accordance with such progressive increases in such analog value, the switches responsive in the repetitive array to the signal of each individual binary significance having the same pattern of connections to the switches responsive to the binary bits of next highest binary significance as the switches responsive in the matrix relationship to the signals of other binary significances have to the switches responsive to the binary signals of next highest significance relative to the signals of such other binary significances.

15. In combination for converting between an analog value and a binary coded value,
means for providing a signal having an amplitude representing the analog value,
means including a plurality of switches defining a repetitive array,
first and second lines,
a plurality of output members each constructed to provide a storage of energy,
means for connecting the switches, the first and second lines and the output members to obtain an electrical continuity between the first line, for progressively increasing analog values represented by the amplitude of the analog signal, and the ones of the output members previously connected to the first line in accordance with such progressively increasing analog values and to obtain an electrical continuity between the second line and the next one of the output members to be connected to the first line for such progressively increasing analog values,
the output members, the first and second lines and the switches defining first mean for converting binary signals of relatively high binary significance into a signal having an analog value representing such binary signals,
second converting means for converting binary signals of lower binary significance than the binary signals of relatively high binary significance to produce an analog signal having an amplitude represented by such binary signals and for introducing such analog signal to the second line,
amplifier means for producing an analog signal having an amplitude representing the difference between the energy stored in the output members connected to the first and second lines and the amplitude of the signal representing the analog value,
means for providing a reference voltage,
means connected in a ladder for providing progressive increments in the reference voltage,
flash comparator means for comparing the amplitude of the signal from the amplifier means and the progressive increments in the reference voltage to produce a plurality of signals having logic levels coded in binary form to indicate the increment of the reference voltage most closely approximating the amplitude of the signal from the amplifier means, and
means for introducing the binary coded signals to the switches in the plurality to control the operation of such switches.

16. In a combination as set forth in claim 15,
means of providing for a plurality of successive approximations by the flash comparator means in producing the binary coded signals having logic levels representing the difference signal from the amplifier means in each such successive approximation, and
means for accumulating in binary form the sum of the difference represented in each successive approximation by the binary signals provided by the last mentioned means and for introducing such accumulation in binary form to the switches to control the operation of such switches.

17. In a combination as set forth in claim 16,
means for providing particular adjustments in the gain of the amplifier means in individual ones of such successive approximations, and means for adjusting the binary significance of the binary signals introduced to the accumulating means in such individual ones of such successive approximations in accordance with the particular adjustments in the gain of the amplifier means in such individual ones of such approximations.

18. In a combination as set forth in claim 16,
means for providing particular adjustments, in the gain of the amplifier means in individual ones of the successive approximations,
means for adjusting the binary significance of the binary signals introduced to the accumulating means in each of the successive approximations in accordance with the particular adjustment in the gain of the amplifier means in such individual ones of such approximations, and
means for introducing to the accumulating means in each of the successive approximations an additional binary signal having a binary significance less than the adjusted binary significance of the least significant of the binary signals introduced to the accumulating means from the flash converter means.

19. In combination for converting between analog value and a binary coded value,
first means for providing a first signal having an amplitude representing the analog value,
second means including a binary-to-analog converter for producing a second signal having an amplitude representing an approximation of the amplitude of the first signal,
third means for comparing the amplitudes of the first and second signals to produce a third signal having an amplitude representing the difference between the amplitudes of the first and second signals,
amplifier means having an adjustable gain and responsive to the third signal for providing a fourth signal having an amplitude related to the amplitude of the third signal and related to the gain of the amplifier means,
fourth means responsive to the amplitude of the fourth signal for producing a plurality of binary signals individually having logic levels representing binary "1" and binary "0" and cumulatively representing the amplitude of the fourth signal,
fifth means responsive to the binary signals for introducing such binary signals to the converter means to adjust the amplitude of the second signal in accordance with the pattern of such binary signals,
sixth means for activating the first means, the third means, the amplifier means, the fourth means and the fifth means in a plurality of successive approximations,
seventh means for adjusting the gain of the amplifier means in individual ones of the successive approximations, and
eighth means responsive to the adjustment in the gain in the amplifier means in the individual ones of the successive approximations for adjusting the weight of the binary signals from the fifth means in such individual ones of the successive approximations to compensate for such adjustment in the gain in the amplifier means.

20. In a combination as set forth in claim 19,
the fourth means including means for providing a reference voltage and means for providing progressive changes from the reference voltage and means for comparing the amplitude of the fourth signal with the progressive changes in the reference voltage and for producing the binary signals in accordance with such comparison.

21. In a combination as recited in claim 19,
means operative in individual ones of the successive approximations for including, with the binary signals, an additional binary signal having a lower binary significance that the binary significance of such binary signals.

22. In a combination as set forth in claim 19,
means for increasing the gain in the amplifier means by a particular amount in individual ones of the successive approximations and for thereafter maintaining a particular gain in the amplifier means after such individual ones of such successive approximations, and
means for adjusting the binary significance of the binary signals in such individual ones and successive ones of the successive approximations in inverse logarithmic relationship to the gain in the amplifier means in such successive approximations.

23. In combination for converting between an analog value and a binary coded value,
means for providing a first signal having an amplitude representing the analog value,
means including a plurality of switches interconnected in sub-sets to define a repetitive array for converting binary coded signals into a second signal having an amplitude representing the analog value, the switches in each of the sub-sets being responsive to one of the binary coded signals of an individual binary significance,
amplifier means responsive to the first and second signals for producing a third signal having an amplitude representing the difference in the amplitudes of the first and second signals,
flash comparator means responsive to the amplitude of the third signal for producing a plurality of binary signals each having logic levels representing binary "1" and binary "0" and cumulatively representing the amplitude of the third signal,
means for providing for a plurality of successive approximations in the production of the second and third signals and in the production of the binary signals,
means responsive to the production by the flash comparator means of the binary signals in each of the successive approximations for adding the binary values represented by such binary signals to the cumulative binary values represented by the logic levels of the binary signals produced by the flash comparator means in the previous ones of the successive approximations, and
means responsive to the binary signals from the last mentioned means for activating the switches in the repetitive array in accordance with the logic levels of such binary signals.

24. In a combination as set forth in claim 23,
means operative in individual ones of the successive approximations for increasing the gain of the amplifier means by particular factors, and
means responsive to the increase in the gain of the amplifier means by the particular factors in the individual ones of the successive approximations for shifting the binary significance of the binary signals from the flash comparator means, before introducing such binary signals to the adding means, by factors related to the particular increases in the gain of the amplifier means.

25. In a combination as set forth in claim 24,
the flash comparator means including a plurality of individual comparators each operative to indicate whether the amplitude of the third signal is within an individual increment of amplitude and each operative in accordance with such indication to produce an individual pattern in the logic levels of the binary signals produced by the flash comparator means.

26. In a combination as set forth in claim 25,
means for providing for the activation of a particular one of the comparators in the flash comparator means in a pair of successive approximations at the end of the plurality of successive approximations.

27. In a combination as set forth in claim 23,
means associated with the comparators in the flash comparator means for including, in the binary signals from the flash comparator means, a binary signal of lower binary significance than those of any of the binary signals from the flash comparator means,
the adding means being responsive to the binary signal from the last mentioned means as well as the binary signals from the flash comparator means.

28. In combination for converting between an analog value and a binary coded value,
first converter means having a plurality of switches connected in a repetitive array, the switches being connected in sub-sets, the switches in each sub-set having the same pattern of interconnections to the switches in the sub-sets of next highest significance as the switches in other sub-sets have to the switches in the sub-sets of next highest significance relative to such other sub-sets,
a plurality of output members connected to the switches to store energy to provide, for increasing analog values, the storage of energy in the ones of the output members previously storing energy and in additional ones of the output members,
first and second lines,
the first line being connected to the output members to produce a first signal having an amplitude coding for the output from the first converter means,
the second line being connected to the particular output member to be connected next to the first line for increasing analog values,
second converter means having a lower binary significance than the first converter means, the second converter means being connected to the second line,
means for providing a second signal having an amplitude representing the analog value,
flash comparator means responsive to the amplitudes of the first and second signals from producing a plurality of binary signals each having logic levels representing binary "1" and binary "0" and cumulatively representing the difference between the amplitudes of the first and second signals, and
means responsive to the logic levels of the binary signals from the flash comparator means for activating the switches in the first converter means and the second converter means in accordance wit the logic levels of such binary signals.

29. In a combination as set forth in claim 28,
means for providing for a plurality of successive approximations in the production of the binary signals by the flash comparator means,
means responsive in each of the successive approximations to the production of the binary signals by the flash comparator means for storing, in a form coded by a plurality of binary signals each having logic levels coding for binary "1" and binary "0", the cumulative value of the binary signals produced in each of such successive approximations and in the previous successive approximations,
the converter means being responsive to the cumulative value of the binary signals produced by the flash comparator means in each of the successive approximations to produce the second signal.

30. In a combination as set forth in claim 28,
amplifier means associated with the flash comparator means for amplifying the signals introduced to the flash comparator means,
the means responsive to the binary signals from the flash comparator means including means for shifting the binary significance of the binary signals from the flash comparator means by a particular function related to the amplification provided by the amplifier means.

31. In a combination as set forth in claim 28,
means for including, with the binary signals from the flash comparator means, a binary signal having logic levels representing binary "1" and "0" and having a binary significance less than the binary significance of any of the signals from the flash comparator means.

32. In combination for converting between an analog value and a binary coded value,
means for providing a first signal having an amplitude representing the analog value,
means including a plurality of switches interconnected to define a repetitive array for converting binary signals into a second signal having an amplitude representing the analog value,
amplifier means responsive to the amplitudes of the first and second signals for producing a third signal having an amplitude representings the difference in the amplitudes of the first and second signals,
means operatively coupled to the amplifier means for providing a controlled gain in the amplification provided by the amplifier means,
flash comparator means responsive to the amplitude of the third signal for producing a plurality of binary signals each having logic levels representing binary "1" and binary "0" and cumulatively representing the amplitude of the third signal,
means for shifting the binary significance of the binary signals from the flash comparator means by a function related to the controlled gain in the amplifier means, and
means for introducing the shifted binary signals to the switches to control the activation of the switches, in accordance with the logic levels of such shifted binary signals, in obtaining the production of the second signal.

33. In a combination as set forth in claim 32
the flash comparator means including a plurality of comparators each constructed, and each connected in the flash converter means, to indicate whether the amplitude of the signal from the amplifier means is within an individual increment of voltage, the flash comparator means being further connected to indicate, by the logic levels of the binary signals, the particular voltage increment which encompasses the amplitude of the signal from the amplifier means.

34. In a combination as set forth in claim 32,
the converting means including first and second converters, the first converter being operative to convert binary signals of relatively high binary significance and the second converter being operative to convert binary signals of relatively low binary significance, the first converter being formed from a plurality of switches connected in the repetitive array and defining subsets, the switches in each subset being responsive only to the logic levels of an individual one of the binary signals, the first converter including a first line providing a signal having an amplitude representing the operation of the switches in the repetitive array and further including a second line connected in the repetitive array to introduce an additional increment to the amplitude of the signal on the first line for each incremental increase in the binary value represented by the binary signals introduced to the switches in the repetitive array, the second line being connected to the second converter for receiving the amplitude of the signal produced by the second converter.

35. In a combination as set forth in claim 32,
means for providing for a particular number of successive approximations,
means for providing for a particular increase in the gain in the amplifier means in such individual ones of such successive approximations, and
means for providing for a shift in the binary significance of the binary signals from the flash comparator means in such individual ones of such successive approximation in accordance with the controlled gain the amplifier means in such individual ones of such successive approximations.

36. In a combination as set forth in claim 33,
means for introducing to the shifting means, in each of the successive approximations, a binary signal having a logic level coding for one half of the least significant bit coded by the logic levels of the binary signals from the flash comparator means to obtain the introduction of this binary signal to the flash comparator means.

37. In combination for converting between an analog value and a binary coded value,
means for providing a first signal having an amplitude representing the analog value,
means for changing to a second signal a plurality of binary signals each having logic levels representing binary "1" and binary "0" and cumulatively representing, by the amplitude of the second signal, an approximation of the analog value,
flash comparator means responsive to the amplitudes of the first and second signals for producing a plurality of binary signals each having logic levels representing binary "1" and binary "0" and cumulatively representing the difference in the amplitudes of the first and second signals,
means operatively coupled to the flash comparator means for adding to the binary signals from the flash comparator means an additional binary signal having a logic level representing binary "1" and binary "0" and having a binary significance less than the binary significance of any of the binary signals from the flash comparator means, and
means for introducing the binary signals from the flash comparator means and the last mentioned means to the changing means.

38. In a combination as set forth in claim 37,
means for providing for a plurality of successive approximations, and
means for accumulating in the changing means the sum of the binary values represented by the logic levels of the binary signals introduced to the flash comparator means in the successive approximations.

39. In a combination as set forth in claim 37,
amplifier means responsive to the amplitudes of the first and second signals for producing a third signal having an amplitude representing any difference in the amplitudes of the first and second signals,
means for producing a controlled increase in the gain of the amplifier means in individual ones of the successive approximations,
the flash comparator means being responsive to the amplitude of the signals from the amplifier means to produce the binary signals for introduction to the changing means, and
means responsive to the binary signals in the individual ones of the successive approximations for shifting the binary significance of the binary signals, before the binary signals are introduced to the changing means, by a factor related to the increase in the gain in the amplifier means in such individual ones of such successive approximations.

40. In combination,
amplifier means,
means for providing an analog input to the amplifier means,
means for providing an adjustable an adjustable control over the gain of the amplifier means,
the adjustable gain control means including:
a plurality of switches,
means for connecting the switches in in sub-sets each having an individual binary significance, the switches in the different sub-sets being connected to define a repetitive array, each of the switches in the repetitive array having first and second states of operation,
a plurality of output members each constructed to store energy,
means for connecting the output members in the plurality to the switches in the repetitive array and to the amplifier means to obtain a storage of energy in the output members in the plurality in accordance with the operation of the switches in the repetitive array in the first and second states, and
means for providing for the operation of the switches in each sub-set in the repetitive array in the first or second state of operation in accordance with the gain to be provided in the amplifier means.

41. In a combination as set forth in claim 40,
means of providing a reference potential, and switching means connected to the switches in the matrix relationship and having first and second modes, the switching means being operative in the first mode to introduce the reference potential to the matrix relationship and being operative in the second mode to connect the output members in the plurality and the matrix relationship across the amplifier means.

42. In a combination as set forth in claim 41, the amplifier means having an output terminal, the output members being connected to the analog input to the amplifier means in the first mode of the switching means and the matrix relationship being connected to the output terminal of the amplifier means in the second mode of the switching means.

43. In a combination as set forth in claim 42,
additional switching means connected across the amplifier means and having first and second modes of operation and operable in the first mode to short circuit the amplifier means and operable in the second mode to provide for the connection of the output members in the plurality and the matrix relationship across the amplifier means.

44. A method of converting an analog value into binary indications representing the analog value, including the steps of:
comparing the analog value and an adjustable analog value in a plurality of successive approximations to obtain a difference value in each of such approximations,
converting the difference value in each of the successive approximations to a corresponding binary coded value with an increased number of binary bits in individual ones of the successive approximations,
increasing the gain of the comparison in individual ones of the successive approximations to obtain increased difference values in accordance with such increases in gain,
shifting the significance of the binary coded value in the individual ones of the successive approximations in accordance with the increase in the gain of the comparison in such individual ones of the successive comparisons to obtain the binary coded value in such individual ones of the comparisons, and
adding the binary coded values in the successive approximations to obtain the binary indications representing the binary value.

45. A method as set forth in claim 44 wherein
the significance of the binary coded value is shifted downwardly in each of the individual ones of the successive approximations by a number of binary bits, equal to the logarithm to the base two, of the increase in the gain of the comparison in each of such individual ones of the successive approximations.

46. A method as set forth in claim 45 wherein
the comparison is made in each of the successive approximations between the difference value and each of a plurality of reference value ranges of progressively increasing magnitude to obtain the conversion of the difference value to the binary coded value in accordance with the individual one of the reference value ranges that most closely approximates the difference value.

47. A method as set forth in claim 46 wherein
each of the reference value ranges is converted to the corresponding binary coded value and a binary value of one half of the least significant binary bit is added to such corresponding binary coded value.

48. A method as set forth in claim 46 wherein
the comparison between the difference value and a particular one of the reference value ranges is made with more precision than the measurement in the other reference value ranges and wherein such comparison is made in at least the last one of the successive approximations.

49. A method of converting an analog value into binary indications representing the analog value, including the steps of:
providing for a plurality of successive approximations,
comparing the analog value and a cumulative value in analog form in each of the successive approximations to obtain a difference value in analog form,
converting the difference value in each of the successive approximations to a binary value representing the difference value and having increasing numbers of binary bits for individual ones of the successive approximations,
adding the binary value in each of the successive approximations to obtain the cumulative value in binary form,
converting the cumulative value in binary form to the cumulative value in analog form,
increasing the gain of the comparison in individual ones of the successive approximations, and
shifting, in such individual ones of the successive approximations, by an amount related to the increase in the gain of the comparison, the significance of the binary value representing the difference value.

50. A method as set forth in claim 49 wherein
the shift in the significance of the binary value in the individual ones of the successive approximations is by a number of binary bits constituting the logarithm of the increases in the gain of the comparison in such individual ones of the successive approximations.

51. A method as set forth in claim 50 wherein
an additional binary bit of a particular binary value and a lower binary significance than the binary value is added in each successive approximation to the binary value representing the difference value in that approximation and wherein the binary value including the additional binary bit is added in each of the successive approximations.

52. A method as set forth in claim 50 wherein
the comparison between the analog value and the cumulative value in analog form is made with greater precision in at least the last one of the successive approximations than the previous ones of the successive approximations.

53. A method of converting an analog value in to binary indications representing the analog value, including the steps of:
comparing the analog value and an adjustable value in analog form in a plurality of successive approximations to obtain a difference value in each of such approximations,
converting the difference value in each of the successive approximations to a corresponding binary coded value with an increased number of binary bits in individual ones of successive approximation,
adding to the binary value, in each successive approximation, an additional binary bit of a particular binary value and of a lower binary significance than the binary value, and
adding the binary values, including the additional binary bit, in the successive approximations to obtain the binary indication representing the analog value.

54. A method as set forth in claim 53 wherein
the comparison between the analog value and the cumulative value in analog form is made with greater precision in at least the last one of the successive approximations than in the previous ones of the successive approximations.

* * * * *